US011138068B2

(12) United States Patent
Cadloni

(10) Patent No.: US 11,138,068 B2
(45) Date of Patent: Oct. 5, 2021

(54) MEMORY SUB-SYSTEM CODEWORD QUALITY METRICS STREAMING

(71) Applicant: Micron Technology, Inc., Boise, ID (US)

(72) Inventor: Gerald L. Cadloni, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 148 days.

(21) Appl. No.: 16/034,128

(22) Filed: Jul. 12, 2018

(65) Prior Publication Data

US 2020/0019460 A1  Jan. 16, 2020

(51) Int. Cl.
| | |
|---|---|
| *G06F 11/00* | (2006.01) |
| *G06F 11/10* | (2006.01) |
| *G11C 29/52* | (2006.01) |
| *G06F 3/06* | (2006.01) |
| *H03M 13/11* | (2006.01) |
| *H03M 13/15* | (2006.01) |

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01); *H03M 13/1102* (2013.01); *H03M 13/152* (2013.01); *H03M 13/1515* (2013.01)

(58) Field of Classification Search
None
See application file for complete search history.

(56) References Cited

U.S. PATENT DOCUMENTS

| | | | | |
|---|---|---|---|---|
| 9,215,268 B1* | 12/2015 | Wood | ................... | H04L 41/5025 |
| 10,423,358 B1* | 9/2019 | Foo | ........................ | G06F 3/0643 |
| 2002/0161911 A1* | 10/2002 | Pinckney, III | ... | H04N 21/23113 709/231 |
| 2011/0093650 A1* | 4/2011 | Kwon | ................... | G06F 11/1441 711/103 |
| 2011/0167227 A1* | 7/2011 | Yang | ................... | H03M 13/1111 711/154 |
| 2013/0262809 A1* | 10/2013 | Wegener | ................. | G06F 12/08 711/165 |
| 2014/0066114 A1* | 3/2014 | Kwon | ................... | H04L 25/067 455/501 |

(Continued)

*Primary Examiner* — Mujtaba M Chaudry
(74) *Attorney, Agent, or Firm* — Perkins Coie LLP

(57) ABSTRACT

Several embodiments of systems incorporating memory devices are disclosed herein. In one embodiment, a memory device can include a controller and a memory component operably coupled to the controller. The controller can include a memory manager, a quality metrics first in first out (FIFO) circuit, and an error correction code (ECC) decoder. In some embodiments, the ECC decoder can generate quality metrics relating to one or more codewords saved in the memory component and read into the controller. In these and other embodiments, the ECC decoder can stream the quality metrics to the quality metrics FIFO circuit, and the quality metrics FIFO circuit can stream the quality metrics to the memory manager. In some embodiments, the memory manager can save all or a subset of the quality metrics in the memory component and/or can use the quality metrics in post-processing, such as in error avoidance operations of the memory device.

10 Claims, 5 Drawing Sheets

(56) References Cited

U.S. PATENT DOCUMENTS

2015/0215413 A1* 7/2015 Lindner .............. H04L 43/0811
709/224
2017/0063692 A1* 3/2017 Roncero Izquierdo ......................
H04L 47/12

* cited by examiner

MEMORY SUB-SYSTEM CODEWORD QUALITY METRICS STREAMING

TECHNICAL FIELD

The present disclosure is related to memory sub-systems. In particular, the present disclosure is related to non-volatile memory devices capable of streaming codeword quality metrics.

BACKGROUND

When data is stored in nonvolatile memory, it is important to have a mechanism that can detect and correct a certain number of errors. Error correction code (ECC) encodes data in such a way that a decoder can identify and correct errors in stored data. For example, data strings can be encoded by an ECC encoder by adding a number of redundant and/or parity bits to them. When an original data string is reconstructed, an ECC decoder examines the encoded data string to check for any errors.

One approach to implementing ECC involves block codes. Block codes are typically used in NAND flash memory systems and work by encoding a block of data (e.g., a block of k data bits) into a block of n bits called a codeword. Each codeword includes a total number of n-k parity bits and is independent of previously encoded messages. Block codes can be linear or non-linear. Examples of linear block codes include repetition codes, parity codes, Hamming codes, and cyclic codes. Examples of non-linear block codes include Nordstrom-Robinson codes, Kerdock codes, Preparata codes, Goethals codes, and Delsarte-Goethals codes.

In addition to outputting error-checked and/or error-corrected data, some implementations of ECC can also generate metadata or metrics regarding an ECC decode operation. Examples of quality metrics can include memory locations where codewords were stored, whether any errors were detected in a codeword, a number of bits in error, a time required to correct the errors, etc. These quality metrics can be used as ECC validation metrics and/or as an ECC debug mechanism in nonvolatile memory systems and devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

As discussed in greater detail below, the technology disclosed herein relates to nonvolatile memory systems and devices capable of streaming codeword quality metrics. A person skilled in the art, however, will understand that the technology may have additional embodiments and that the technology may be practiced without several of the details of the embodiments described below with reference to FIGS. 1-5. In the illustrated embodiments below, the memory devices are primarily described in the context of devices incorporating NAND-based storage media (e.g., NAND flash). Memory devices configured in accordance with other embodiments of the present technology, however, can include other types of memory devices (e.g., 3D-NAND, phase change memory, ferroelectric, etc.) and/or can include main memories that are not NAND-based (e.g., NOR-based) or only partially NAND-based.

Figure 1:
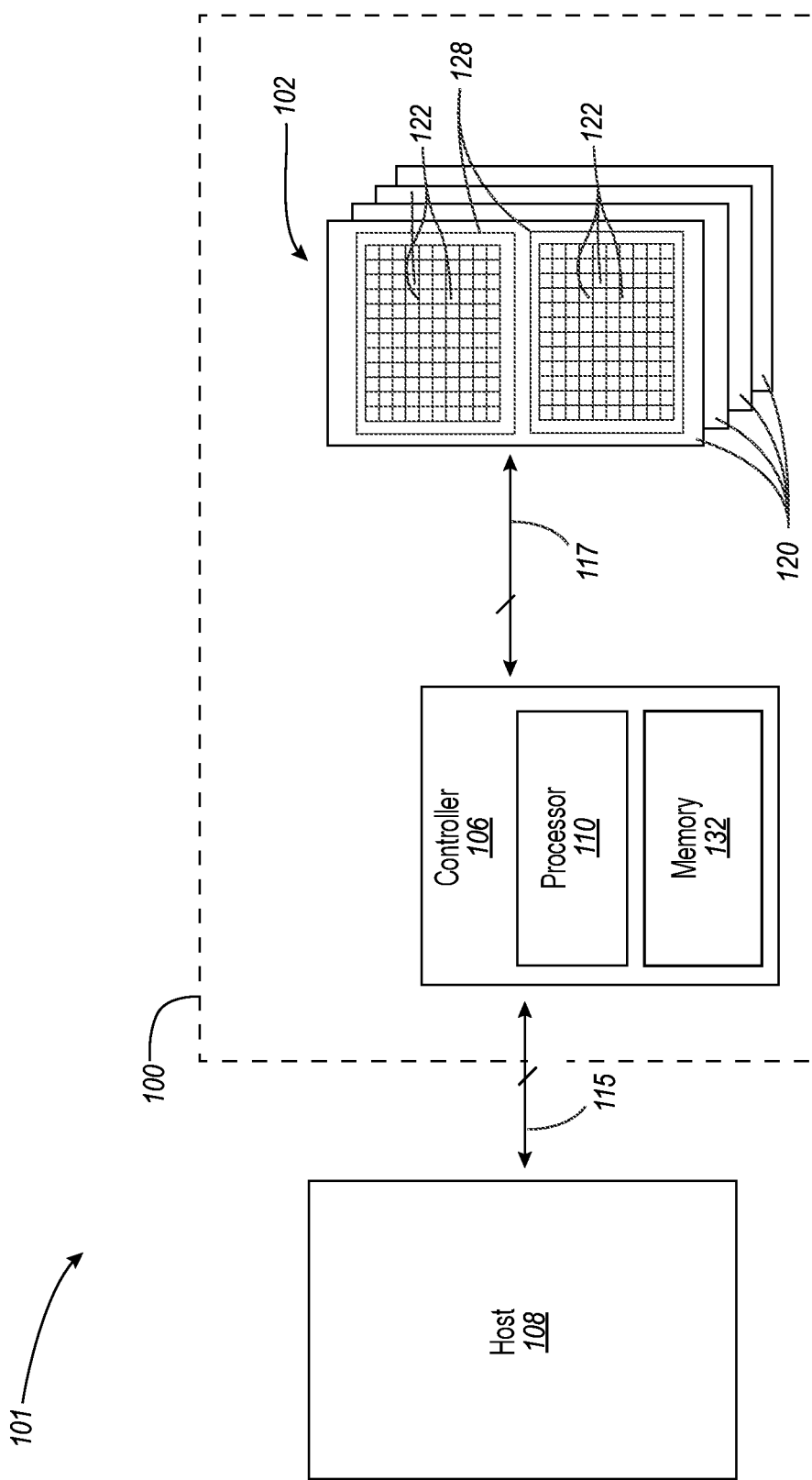
FIG. 1 is a block diagram of a system having a memory device configured in accordance with an embodiment of the present technology.

FIG. 1 is a block diagram of a system 101 having a memory sub-system (also hereinafter referred to as a "memory device" (e.g., memory device 100)) configured in accordance with an embodiment of the present technology. An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system. As shown, the memory device 100 includes one or more memory components (e.g., memory component 102) and a controller 106 (e.g., a processing device) operably coupling the memory component 102 to a host device 108 (e.g., an upstream central processor (CPU)). The memory component 102 includes a plurality of memory regions, or memory units 120, which include a plurality of memory cells 122. Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, NAND flash and/or other suitable storage elements (e.g., NOR flash, read only memory (ROM), electrically erasable programmable ROM EEPROM, erasable programmable ROM (EPROM), ferroelectric, magnetoresistive, phase change memory, etc.) configured to store data persistently or semi-persistently. The memory component 102 and/or the individual memory units 120 can also include other circuit components (not shown) (e.g., memory subsystems), such as multiplexers, decoders, buffers, read/write drivers, address registers, data out/data in registers, etc., for accessing and/or programming (e.g., writing) the memory cells 122 and other functionality, such as for processing information and/or communicating with the controller 106 via a device bus 117.

The controller 106 can be a microcontroller, special purpose logic circuitry (e.g., a field programmable gate array (FPGA), an application specific integrated circuit (ASIC), etc.), or other suitable processor. The controller 106 can include a processor 110 having, for example, a microcontroller (not shown) and a memory manager (not shown). The processor 110 is configured to execute instructions stored in memory, such as ECC operations. The processor 110 can be a processing device. In the illustrated example, the controller 106 includes an embedded memory 132 configured to store various processes, logic flows, and routines for controlling operation of the memory device 100, including managing the memory component 102 and handling communications between the memory device 100 and the host device 108. In some embodiments, the embedded memory 132 can include memory registers storing, e.g., memory pointers, fetched data, etc. The embedded memory 132 can also include read-only memory (ROM) for storing micro-code. As described in greater detail below, the controller 106 can include ECC hardware (not shown), such as an ECC engine (not shown), configured to encode and/or decode data stored in the memory component 102. In operation, the controller 106 can directly read, write, or otherwise program (e.g., erase) the various memory regions of the memory component 102, such as by reading from and/or writing to groups of memory cells 122 (e.g., memory pages, stripes of memory pages, memory blocks 128, etc.).

The controller 106 communicates with the host device 108 over a system bus 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation).

Figure 2:
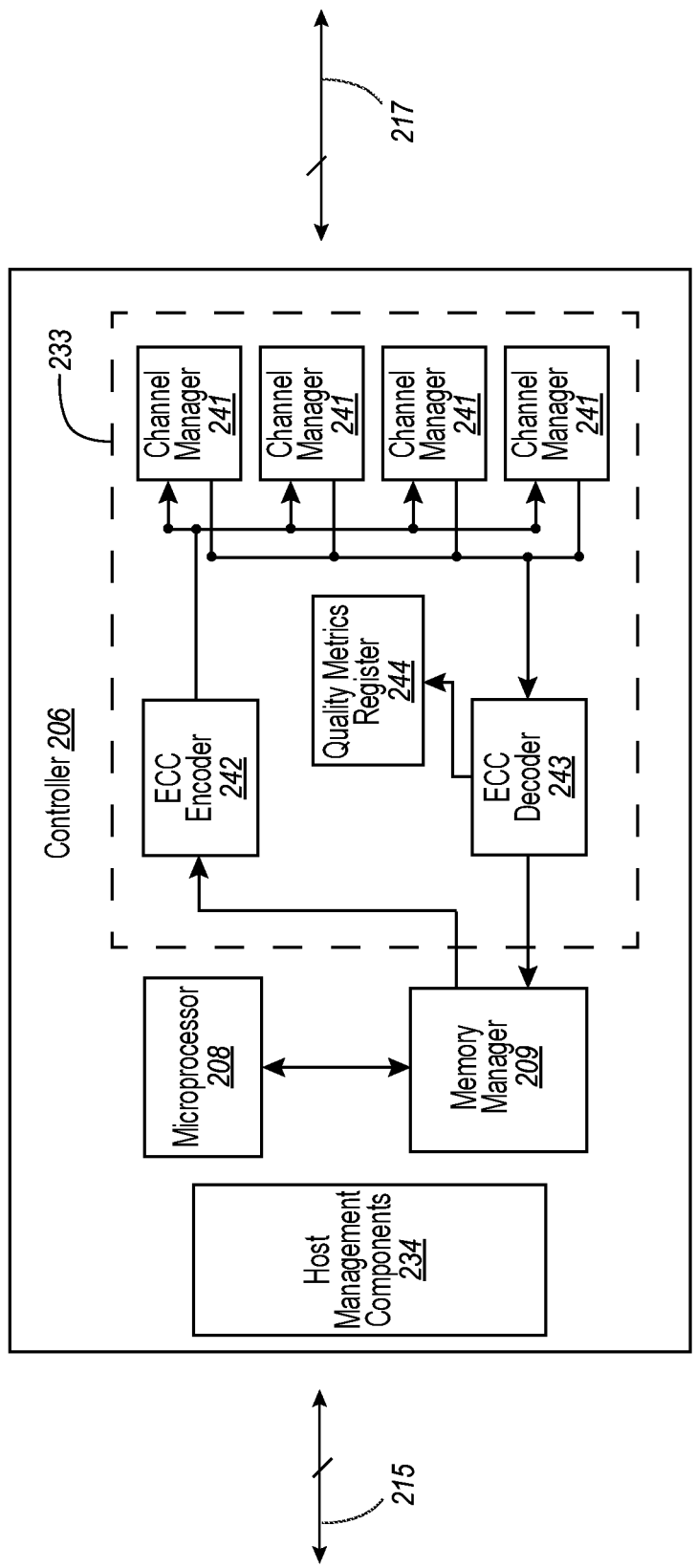
FIG. 2 is a block diagram of a memory controller having a quality metrics register in accordance with one ECC implementation.

FIG. 2 is a block diagram of a controller 206 (e.g., the controller 106; FIG. 1) that can be used in the memory device 100 and/or in the memory system 101. As shown, the controller 206 can include a microprocessor 208, a memory manager 209, host management components 234, and media management components 233. The host management components 234 are configured to manage communications between the host device 108 and the controller 206 via a system bus 215 (e.g., the system bus 115). The media management components 233 are configured to communicate with the memory component 102 of a memory device 100 via a device bus 217 (e.g., the device bus 117).

In the illustrated embodiment, the media management components 233 include one or more memory channel managers 241, an ECC encoder 242, an ECC decoder 243, and a quality metrics register 244. The ECC encoder 242 and the ECC decoder 243 can be components of one or more ECC engines (not shown). In some embodiments, one or more of the ECC engines can be a Bose-Chaudhuri-Hocquenghem (BCH) ECC engine and/or a low-density parity check (LDPC) ECC engine. In these and other embodiments, one or more of the ECC engines can be a Reed-Solomon (RS) ECC engine, a tightly-coupled memory (TCM) ECC engine, and/or another type of ECC engine.

The ECC encoder 242 and the ECC decoder 243 are configured to encode and decode, respectively, data stored in the memory component 102 of the memory device 100 (e.g., to detect and/or correct errors in data read out from, written to, and/or stored in the memory component 102). More specifically, the ECC encoder 242 is configured to encode data (e.g., received from the memory manager 209) in accordance with one or more ECC approaches (e.g., block codes, convolution codes, and others) to create codewords. For example, the ECC encoder 242 can encode a data string by adding a number of redundant bits to the data string. In a specific example, the ECC encoder 242 can encode a data string with k number of bits into a block with n number of bits having k-n parity bits in accordance with a block ECC. Blocks with parity bits in this example are called codewords. Codewords created by the ECC encoder 242 in the illustrated embodiment are passed to the channel manager(s) 241 to write codewords to memory regions in the memory component 102. In some embodiments, each memory page in the memory component 102 of the memory device 100 is configured to store four codewords. In other embodiments, each memory page is configured to store 16 codewords. In still other embodiments, the number of codewords a memory page is configured to store can vary. For example, memory pages in other embodiments can be configured to store a greater (e.g., 17 or more) or lesser (e.g., 15 or less and/or three or less) number of the codewords per memory page.

When codewords are read out from the memory component 102 via the memory manager(s) 241 (e.g., during an access and/or a scan operation of the memory device 100), the ECC decoder 243 decodes each codeword created by the ECC encoder 242 to reconstruct the original data string(s). In some embodiments, the controller 206 can scan the memory component 102 and/or the embedded memory 132 (e.g., by die, by block, by memory page, by stripes of memory pages, etc.) to ensure data stored on the memory component 102 and/or on the embedded memory 132 has not and/or will not become corrupted (e.g., as part of a manufacturing and/or end-user error avoidance operation of the memory device 100). The scan function can be similar to an accessing function of the memory device 100 in that one or more codewords are read from the memory component 102. Thus, the ECC decoder 243 is used to decode each codeword read into the controller 206 under an access operation and a scan operation of the memory device 100. The scan operation differs from the access operation, however, in that original data strings that are reconstructed from the codewords are not output to the host device 108.

The ECC decoder 243 uses the codewords (e.g., the parity bits) of each data string to provide an indication of whether there are errors in the bits of the data string. An error, or bit flip, occurs if a bit is read in a first logic state (e.g., "0") when the bit was intended to be in a second logic state (e.g., "1"). Similarly, a bit flip occurs if a bit is read in the second logic state when the bit was intended to be in the first logic state. Common reasons for bit flips include writing the data string to memory at elevated temperatures and/or reading the data strings from memory in the presence of a large amount of noise. Other reasons for bit flips include defects in the memory cells 122 storing the bits of data. If one or more bit flips are present, the ECC decoder 243 can employ one or more ECC operations to correct the errors and to recover the original data string. In some embodiments, the ECC decoder 243 provides original, decoded data strings to the memory manager 209 and/or another component of the controller 206 (e.g., to provide the original, decoded data strings to the host device 108).

During an ECC decode operation, the ECC decoder 243 can generate quality metrics regarding codewords and/or memory regions (e.g., memory dies, memory units 120, memory blocks 128, memory pages, stripes of memory pages, memory cells 122, etc.) of the memory component 102 where the codewords were stored. Quality metrics generated by the ECC decoder 243 can include, for example, (i) a location (e.g., a memory region) in memory where a codeword was stored; (ii) whether errors were detected in the codeword; (iii) the number of bit flips present in a codeword (i.e., the number of bit errors that needed to be corrected in order to clear a codeword and to recover an original data string); (iv) whether bit flips were encountered in the corresponding memory region in the past; and/or (v) ECC operations used to recover the original data string. In these and other embodiments, quality metrics can further include information regarding how much energy was consumed by ECC operations used to recover the original data string and/or an amount of time (e.g., processing time) required to recover the original data string.

Quality metrics can be used by controllers (e.g., the controller 206) for ECC validation and/or debugging operations of the ECC engine. As shown in FIG. 2, for example, the ECC decoder 243 of the controller 106 is configured to send quality metrics of each codeword read from the memory component 102 to the quality metrics register 244 for subsequent ECC validation and/or debugging of the ECC engine (e.g., of the encoder 242 and/or of the ECC decoder 243). The quality metrics register 244 in this embodiment stores the quality metrics of a codeword until it receives quality metrics of the next codeword read from the memory component 102 and/or for another specified duration (e.g., time, boot cycles, ECC iterations, until the memory device 100 is powered off, etc.).

Aside from ECC validation and ECC debugging, however, many controllers do not use quality metrics generated by the decode operation and therefore do not place quality metrics within the data path of the conventional controllers. For example, the quality metrics register 244 in the controller 106 of FIG. 2 is not coupled to the microprocessor 208 or the memory manager 209 and therefore is outside the data path of the controller 206. As a result, quality metrics created during the ECC decode operation are not provided to the microprocessor 208 or the memory manager 209 under normal operation of the controller 206. To transfer the quality metrics data to the microprocessor 208 and/or the memory manager 209, the microprocessor 208 would, for each codeword, interrupt the ECC decode operation in the ECC decoder 243 to collect quality metrics for a corresponding codeword from the quality metrics register 244. Once collected, the microprocessor 208 would then save the quality metrics to memory (e.g., by passing the quality metrics to the memory manager 209, through the ECC encoder 242, and/or into the memory component 102 using the channel manager(s) 241) before the ECC decoder 243 can resume the ECC decode operation on the next codeword read from the memory component 102. Considering the number of codewords per memory page (e.g., typically from four to 16 codewords per memory page) and that most read operations of the memory device 100 are performed on a memory block basis (e.g., having from one memory page to over 5,000 memory pages), stopping the ECC decode operation for each codeword to retrieve its corresponding quality metrics is inefficient and would lead to a large performance loss of the controller 206 and/or of the memory device 100. As a result, quality metrics in conventional controllers (e.g., the controller 206) are not available in real time and/or are not output to the microprocessor 208 or to the memory manager 209 at all.

Quality metrics, however, are an important component of several error avoidance operations of several memory devices 100. For example, continuous read level calibration (cRLC), dynamic program target (DPT) calibration, dynamic program step (DPS) calibration, and figures of merit (FoM) data collection are each error avoidance operations that can utilize quality metrics during the manufacture or operation of the memory device 100 to calibrate memory regions (e.g., memory cells 122, memory pages, memory blocks, memory dies, etc.) of the memory device 100.

Additionally or alternatively, several error avoidance operations of an end-user memory device 100 can utilize quality metrics (i) to operate more efficiently and/or effectively. For example, cRLC, DPT for read window budge (RWB) measurements and improvements, background scans, read disturb induced background scans, partial block erase page check background scans, and power loss recovery procedures each use quality metrics of the codewords as error avoidance operations within an end-user memory device 100.

Figure 3:
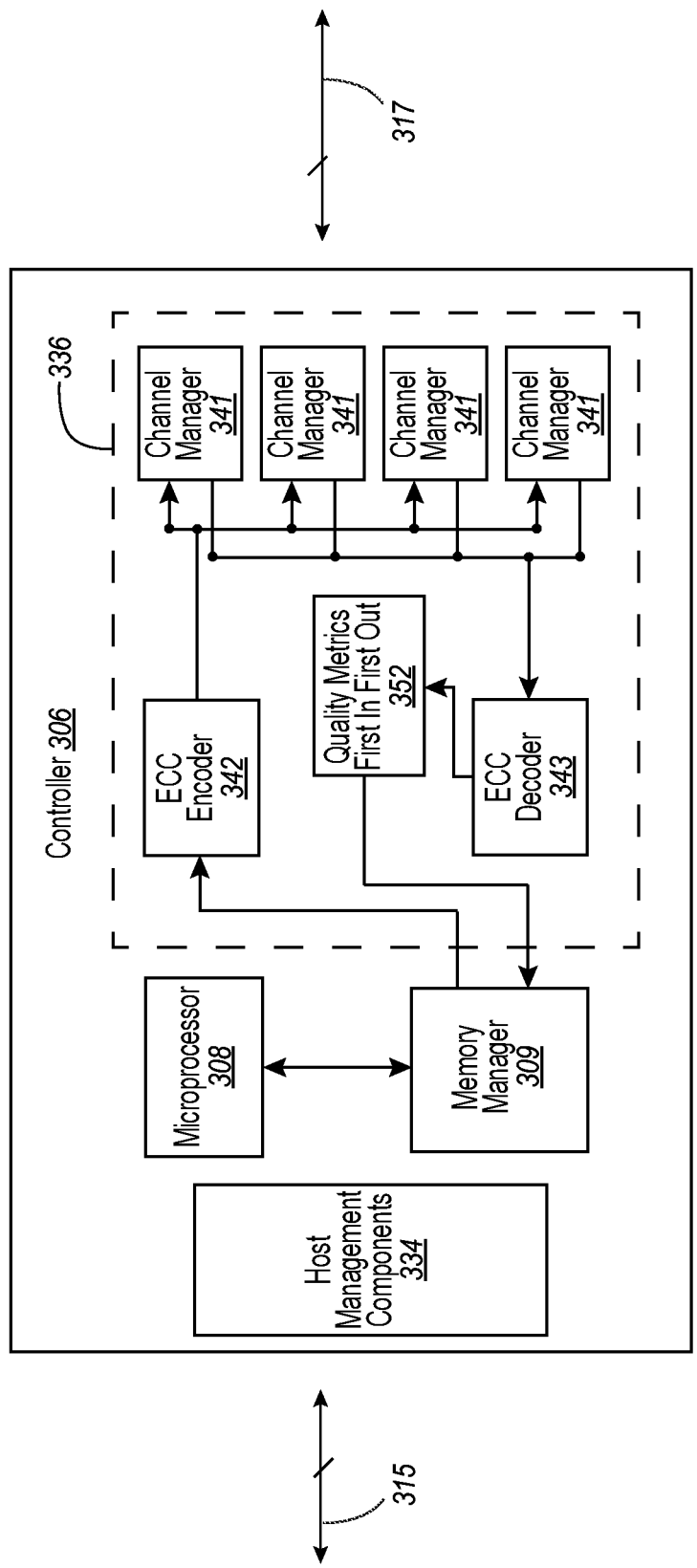
FIG. 3 is a block diagram of a memory controller having a quality metrics first in first out (FIFO) circuit and configured in accordance with an embodiment of the present technology.

FIG. 3 is a block diagram of a memory controller 306 configured in accordance with an embodiment of the present technology. As shown, the controller 306 is similar to the controller 206 in that the controller 306 includes a microprocessor 308, a memory manager 309, host management components 334, and media management components 336. The media management components 336 of the controller 306, however, include a quality metrics first in first out (FIFO) circuit 352 in lieu of the quality metrics register 244. In other embodiments, the controller 306 can include the quality metrics FIFO circuit 352 in addition to a quality metrics register 244. In some embodiments, the FIFO circuit 352 comprises one or more holding registers. In these and other embodiments, the FIFO circuit 352 includes other components in addition to or in lieu of one or more of the holding register(s).

In the illustrated embodiment, an ECC decoder 343 of the controller 306 is configured to receive codewords from one or more channel managers 341 of the media management components 336 that were created by an ECC encoder 342 of the controller 306 and/or that were read out from the memory component 102 of the memory device 100. In some embodiments, the codewords can be read out during an access and/or scan operation of the memory device 100. The ECC decoder 343 can decode the codewords to reconstruct original data strings that were encoded by the ECC encoder 342. During the decode operation, the ECC decoder 343 can generate quality metrics corresponding to each codeword. In some embodiments, the ECC decoder 343 can generate only those quality metrics specified by the controller (e.g., the number of bit flips required to clear a codeword) for each codeword.

As shown in FIG. 3, the ECC decoder 343 can output any resulting quality metrics to the quality metrics FIFO circuit 352. In turn, the quality metrics FIFO circuit 352 of the controller 306 is configured to output the quality metrics to the memory manager 309. In these and other embodiments, the ECC decoder 343 can output original, decoded data strings to the quality metrics FIFO circuit 352 in addition to the resulting quality metrics such that the quality metrics FIFO circuit 352 outputs the original, decoded data strings and the resulting quality metrics to the memory manager 309. Alternatively, the ECC decoder 343 can be configured to send the original, decoded data strings directly to the memory manager 309 and/or another component of the controller 206 (e.g., to output the decoded data strings to the host device 108), and to send only the quality metrics to the FIFO circuit 352. In these and still other embodiments, the ECC decoder 343 and/or the quality metrics FIFO circuit 352 can be configured to output only a portion (e.g., the number of bit flips required to clear a codeword and/or to clear a select subset of codewords, the ECC operation used to correct the bit flips and to recover the original data string, etc.) of the quality metrics to the memory manager 309 (e.g., to further reduce energy consumed by the quality metrics streaming, saving, and/or processing operations of the controller 306). In these embodiments, the ECC decoder 343 and/or the quality metrics FIFO circuit 352 can discard the remaining portions of the resulting quality metrics not output to the quality metrics FIFO circuit 352 and/or to the memory manager 309.

In some embodiments, the controller 306 (e.g., the ECC engine, the ECC decoder 343, and/or the quality metrics FIFO circuit 352) is configured to output (e.g. stream) the quality metrics in real time (e.g., without a configured delay) to the memory manager 309 during a read operation of data stored on the memory component 102. In other words, memory controllers (e.g., the memory controller 306 shown in FIG. 3) configured in accordance with the present technology are configured to stream (e.g., all or a subset of) the quality metrics generated by a decode operation to the memory manager 309 (i.e., output the quality metrics without interrupting the ECC decode operation of the ECC decoder 343 and/or as the quality metrics are generated). As a result, memory controllers configured in accordance with the present technology are expected to achieve faster test times of the memory device 100 during manufacturing (e.g., by reducing the time required to collect quality metrics for error avoidance procedures, ECC validation, ECC debugging, etc.), leading to a reduction in the cost of manufacturing the memory devices 100. Additionally or alternatively, memory controllers configured in accordance with the present technology are expected to provide quality metrics for post-processing in end-user error avoidance operations, ECC validation, ECC debugging, and/or other operations of the controllers while avoiding the significant performance loss that would result by interrupting the ECC decode operation.

In these and other embodiments, the controllers (e.g., the controller 306) can include a quality metrics register (e.g., the quality metrics register 244; FIG. 2) in addition to the quality metrics FIFO circuit 352. In these embodiments, the controller 306 can be configured to store the quality metrics in the quality metrics register for a desired duration (e.g., for ECC debugging and/or ECC validation). In these and still other embodiments, the controller 306 can transfer the quality metrics from the quality metrics register (i) to the memory manager 309 and/or other components of the memory device 100 and/or (ii) at a desired cadence (e.g., in real-time and/or at a desired periodicity). In other embodiments, the controller 306 can include one or more other streaming components in addition to or in lieu of the FIFO circuit 352, such as a different type of buffer (e.g., a last in, first out (LIFO) circuit).

As shown in FIG. 3, the memory manager 309 is configured to receive and process the quality metrics. In some embodiments, the memory manager 309 is configured to store the quality metrics (e.g., to a location in the memory component 102) by encoding the quality metrics using the ECC encoder 342 and outputting the corresponding codewords to the memory component 102 via the channel manager(s) 341. In these and other embodiments, the memory manager 309 can save all or a subset of the quality metrics of a codeword and/or of select codewords in the memory component 102, or in another memory location (e.g., in an embedded memory of the controller 306). For example, the memory manager 309 can decide to save only a portion of the quality metrics data (e.g., the number of bit flips required to clear a codeword and/or to clear a select subset of codewords) to the memory component 102. In these embodiments, the memory manager 309 can discard the remaining portion(s) of the quality metrics not saved to the memory component 102.

As a result, when a read operation (e.g., an accessing operation and/or a scan operation) is complete, all or a subset of quality metrics regarding the decoded codewords read from the memory component 102 can be saved in the memory component 102 and available for post-processing. In some embodiments, the controller 306 (e.g., the memory manager 309) can index (e.g., tag) the quality metrics saved to the memory component 102 in accordance with a desired format. For example, the controller 306 (e.g., the memory manager 309) can assign a JavaScript Object Notation (JSON) key or value to the quality metrics of each codeword when the quality metrics are saved to the memory component 102. In this manner, the quality metrics of each codewords can be conveniently referenced and/or used in post-processing (e.g., by the microprocessor 308 and/or in error avoidance operations of the memory device 100). Thus, memory controllers (e.g., the memory controller 306) configured in accordance with the present technology are expected to achieve increased performance (i) by enabling error avoidance operations that require quality metrics on the memory device 100 and/or (ii) by reducing the overhead (e.g., the performance hit in collecting quality metrics) of media management tasks (e.g., of the error avoidance operations). In turn, the increased performance of the memory device 100 leads to an increase in the quality of service delivered to an end-user.

Figure 4:
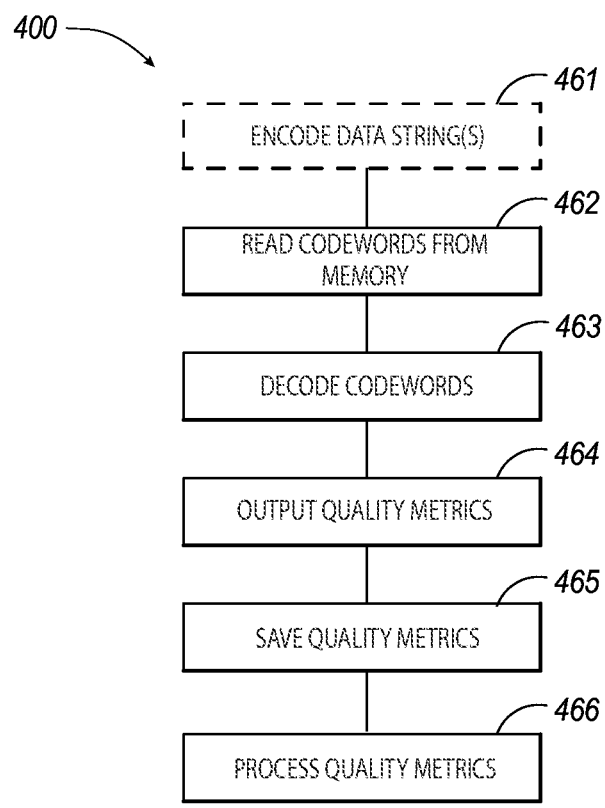
FIG. 4 is a flow diagram illustrating a routine that is executed, at least in part, by a nonvolatile memory device in accordance with an embodiment of the present technology.

FIG. 4 is a flow diagram illustrating a routine 400 directed to a method of collecting quality metrics of one or more codewords of data stored in memory (e.g., the memory component 102; FIG. 1) of a memory device (e.g., the memory device 100; FIG. 1) in accordance with an embodiment of the present technology. In some embodiments, the routine 400 can be carried out by components of a controller (e.g., the controller 106 and/or 306; FIGS. 1 and/or 3) of the memory device. For example, all or a subset of the steps in the routine 400 can be performed by media management components (e.g., the media management components 336; FIG. 3), a microprocessor (e.g., the microprocessor 308; FIG. 3), and/or a memory manager (e.g., the memory manager 309; FIG. 3) of the controller. In these and other embodiments, all or a subset of the steps of the routine 400 can be performed by other components of the memory device (e.g., components of the memory component 102; FIG. 1) and/or by components of a host device (e.g., the host device 108; FIG. 1).

As shown in FIG. 4, the routine 400 can begin at block 461 to encode data and save the encoded data to memory. Alternatively, the routine 400 can begin at block 462 to read encoded data (e.g., codewords) from memory. In embodiments where the routine 400 begins at block 461, the routine 400 can encode one or more data strings (e.g., using an ECC encoder of a controller and/or of the memory device) to create corresponding codewords and can save the codewords to the memory (e.g., using one or more channel managers of the controller). In some embodiments, the codewords can be saved to a memory component (e.g., the memory component 102; FIG. 1) of the memory device. In these and other embodiments, the codewords can be saved to another memory of the memory device (e.g., an embedded memory of the controller).

Alternatively or subsequently, the routine 400 can read one or more codewords (i.e., the encoded data) from the memory at block 462. For example, the routine 400 can read the codewords into the controller and/or into an ECC decoder of the memory device (e.g., using the one or more channel managers of the controller). In these and other embodiments, the routine 400 can read the codewords from the memory component and/or from another memory of the memory device (e.g., an embedded memory of the controller). In some embodiments, the read operation can be a part of an access operation and/or a scan operation of the memory device. In these and other embodiments, the routine 400 can perform the read operation on a memory page basis, on a stripe of memory pages basis, on a memory block basis, and/or on a memory superblock basis. In these and still other embodiments, the routine 400 can perform the read operation on a memory die basis and/or on a memory device basis (e.g., as part of a full memory device scan).

At block 463, the routine 400 can decode the codewords to reconstruct the original data strings saved to memory and/or to generate quality metrics regarding the codewords. For example, the routine 400 can decode the codewords using an ECC decoder of the memory device (e.g., of the controller) in accordance with ECC operations. In some embodiments, the routine 400 serially decodes the codewords. In other embodiments, the routine 400 can decode multiple codewords in parallel (e.g., using multiple ECC decoders). In these and other embodiments, the routine 400 can generate only desired and/or defined quality metrics (e.g., the number of bit flips required to clear a codeword) as opposed to all of the quality metrics that may be generated in connection with a decode operation.

At block 464, the routine 400 outputs the quality metrics. In some embodiments, the routine 400 outputs the quality metrics to a quality metrics FIFO circuit of the memory device (e.g., of the controller). In these and other embodiments, the routine 400 can output the quality metrics to a memory manager of the memory device (e.g., of the controller) additionally or alternatively to outputting the quality metrics to the quality metrics FIFO circuit. The routine 400 can output (e.g., stream) the quality metrics in real time (e.g., as the quality metrics are generated and/or become available). In these and other embodiments, the routine can output the quality metrics at a desired cadence (e.g., using a quality metrics register). In still other embodiments, the routine 400 can output all or a portion of any generated quality metrics. For example, the routine 400 can output only a select subset (e.g., the number of bit flips required to clear a codeword) of the generated quality metrics (e.g., using the ECC decoder and/or the quality metrics FIFO circuit). In some of these embodiments, the routine 400 can discard any quality metrics the routine 400 does not output.

At block 465, the routine 400 saves the quality metrics. For example, the routine 400 can encode the quality metrics output (e.g., using an ECC encoder of the memory device) to generate corresponding codewords. In some embodiments, the routine 400 can save the quality metrics and/or the corresponding codewords in the memory component and/or another memory of the memory device (e.g., an embedded memory of the controller). In these and other embodiments, the routine 400 can save all or a portion of the quality metrics. For example, the routine 400 can save only a select subset (e.g., the number of bit flips required to clear a codeword) of the quality metrics to memory. In some of these embodiments, the routine 400 can discard any quality metrics the routine 400 does not save. In these and other embodiments, the routine 400 can index (e.g., tag) the quality metrics and/or the corresponding codewords saved to memory. For example, the routine 400 can generate and assign a JSON key or value to the quality metrics and/or to the corresponding codewords saved to memory. The routine 400 can return to block 462 to read one or more codewords from memory, and/or the routine 400 can proceed to block 466.

At block 466, the routine 400 can process the quality metrics. For example, the routine 400 can process the quality metrics using a processor of the memory device (e.g., a microprocessor of the controller). In some embodiments, the routine 400 can process the quality metrics saved to memory at block 465 (e.g., using indexes assigned to the quality metrics and/or to the corresponding codewords at block 465). In these and other embodiments, the routine 400 can process (e.g., all or a subset of the) quality metrics (e.g., in real time) before and/or after all or a subset of the quality metrics are saved to memory at block 465. In these and still other embodiments, the routine 400 can use (e.g., all or a subset of) the quality metrics in ECC validation, ECC debugging, error avoidance, and/or other operations of the memory device. The routine 400 can proceed to block 465 to save the quality metrics, can proceed to block 461 to encode one or more data strings, can proceed to block 462 to read codewords from memory, and/or can terminate.

Although the steps of the routine 400 are discussed and illustrated in a particular order, the method illustrated by the routine 400 is not so limited. In other embodiments, the method can be performed in a different order. In these and other embodiments, any of the steps of the routine 400 can be performed before, during, and/or after any of the other steps of the routine 400. Moreover, a person of ordinary skill in the relevant art will readily recognize that the illustrated method can be altered and still remain within these and other embodiments of the present technology. For example, one or more steps of the routine 400 illustrated in FIG. 4 can be omitted from and/or repeated in some embodiments.

Figure 5:
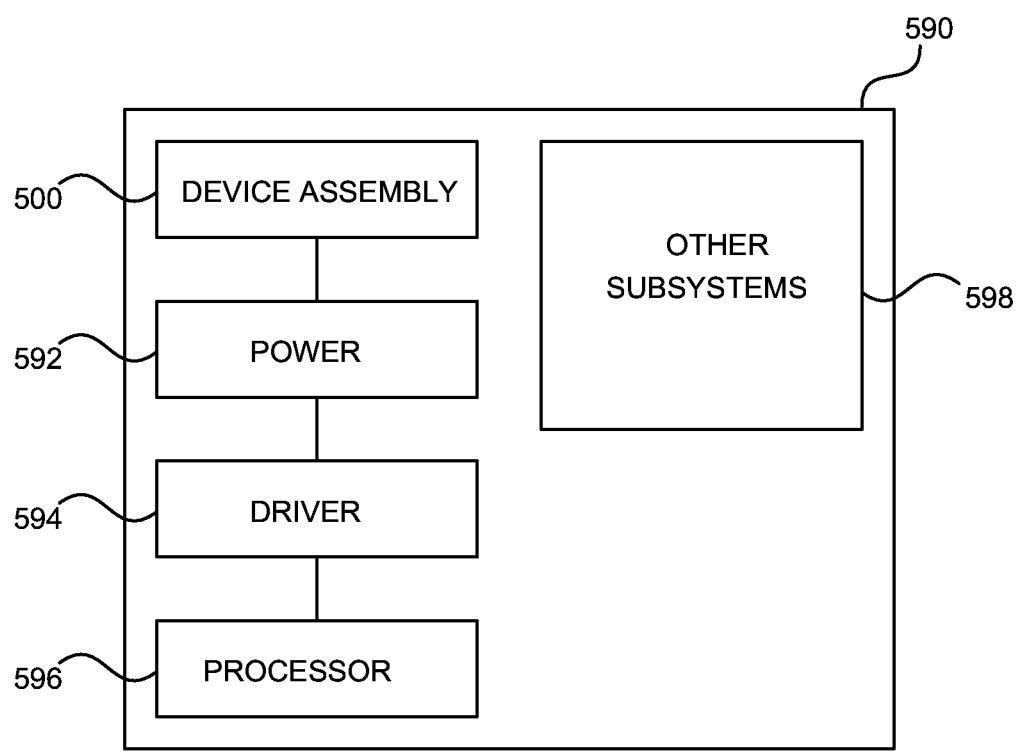
FIG. 5 is a schematic view of a system that includes a memory device in accordance with embodiments of the present technology.

FIG. 5 is a schematic view of a system that includes a memory device in accordance with embodiments of the present technology. Any one of the foregoing memory devices described above with reference to FIGS. 1-4 can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory device described above with reference to FIGS. 1-4, and can, therefore, include various features of memory content authentication. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, a memory device (e.g., a memory controller) configured in accordance with an embodiment of the present technology can generate and/or output (e.g., stream) quality metrics regarding codewords stored in memories of the memory device (e.g., an embedded memory of a controller of the memory device) other than the memory component of the memory device. In these and other embodiments, codewords can be encoded and/or decoded and/or quality metrics regarding the codewords can be generated and/or output (e.g., streamed) by components (e.g., media management components and/or ECC engines of the memory component) other than the main controller of the memory device. In addition, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

From the foregoing, it will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

I claim:

1. A memory controller, comprising:
a memory manager;
a quality metrics first in first out (FIFO) circuit; and
an error correction code (ECC) decoder, wherein the ECC decoder is configured to decode a plurality of codewords corresponding to data stored in memory using a decode operation,
generate a plurality of quality metrics, each corresponding to one of the plurality of decoded codewords, and
route the plurality of quality metrics to the memory manager by outputting the plurality of quality metrics directly to the quality metrics FIFO circuit in real-time as quality metrics of the plurality of quality metrics are generated,
wherein the quality metrics FIFO circuit is configured to output the plurality of quality metrics directly to the memory manager in real-time as the quality metrics FIFO circuit receives the quality metrics of the plurality of quality metrics directly from the ECC decoder.

2. The memory controller of claim 1, wherein the memory manager is configured to store the plurality of quality metrics.

3. The memory controller of claim 1, wherein the memory manager is configured to store a subset of the plurality of quality metrics.

4. The memory controller of claim 3, wherein the subset of the plurality of quality metrics is a number of bit flips to clear a respective codeword.

5. The memory controller of claim 3, wherein the memory manager is further configured to discard the generated quality metrics not included in the subset.

6. The memory controller of claim 1 further comprising a microprocessor, and wherein the microprocessor is configured to use the generated quality metrics in one or more error avoidance operations, in one or more ECC debugging operations, and/or in one or more ECC validation operations.

7. The memory controller of claim 1, wherein the memory manager is further configured to index the generated quality metrics saved in memory in a predetermined format.

8. The memory controller of claim 7, wherein the predetermined format is JSON, and wherein the memory manager is further configured to assign a JSON key to the generated quality metrics saved in memory.

9. The memory controller of claim 1, further comprising an ECC encoder, and wherein the memory manager is configured to output the generated quality metrics to the ECC encoder to encode the generated quality metrics.

10. The memory controller of claim 1, further comprising an ECC engine, wherein the ECC engine comprises the ECC decoder and an ECC encoder, and wherein the ECC engine is a Bose-Chaudhuri-Hocquenghem (BCH) ECC engine, a low-density parity check (LDPC) ECC engine, a Reed-Solomon (RS) ECC engine, and/or a tightly-coupled memory (TCM) ECC engine.

* * * * *